United States Patent [19]

Honma

[11] Patent Number: 5,245,311

[45] Date of Patent: Sep. 14, 1993

[54] LOGICAL COMPARISON CIRCUIT FOR AN IC TESTER

[75] Inventor: Tatsuya Honma, Gyoda, Japan

[73] Assignee: Advantest Corporation, Tokyo, Japan

[21] Appl. No.: 827,747

[22] Filed: Jan. 29, 1992

[30] Foreign Application Priority Data

Feb. 1, 1991 [JP] Japan .................. 3-012211

[51] Int. Cl.$^5$ ...................... H03K 19/00; H03K 19/02
[52] U.S. Cl. .................... 340/146.2; 307/440; 307/480; 324/76.47; 324/76.55; 377/39; 377/19
[58] Field of Search .............. 340/146.2; 307/440, 307/442, 470, 471, 480; 324/79 D; 377/19, 39

[56] References Cited

U.S. PATENT DOCUMENTS

| | | | |
|---|---|---|---|
| 3,613,082 | 10/1971 | Bouchard | 340/146.2 |
| 3,622,987 | 11/1971 | Borkan | 340/146.2 |
| 4,001,699 | 1/1977 | Denny et al. | 377/39 |
| 4,180,797 | 12/1979 | Shimokawa | 377/39 |

Primary Examiner—Edward P. Westin
Assistant Examiner—Richard Roseen
Attorney, Agent, or Firm—Staas & Halsey

[57] ABSTRACT

In the case of setting one comparison timing in one operation period, a select signal is set to the "0" level, by which first, second and third counters are each put in the state of operation of a 1-to-4 frequency dividing counter which produces four frequency-divided outputs sequentially displaced apart in phase in a cyclic order. A first comparison clock is frequency divided by the first counter and its four frequency-divided outputs are used to latch a comparison signal in four first latch circuits in a sequential order, by which the comparison signal is demultiplexed and expanded. A first system clock is frequency divided by the second counter down to ¼ and its four frequency-divided outputs are used to latch an expected value signal in four second latch circuits in a sequential order, by which the expected value signal is demultiplexed and expanded. The corresponding ones of the outputs from the first and second latch circuits are subjected to logical comparison by four comparators. A second system clock is frequency divided by the third counter down to ¼ and its four frequency-divided outputs are used to time division multiplex the outputs of the four comparators one after another to obtain comparison result data of the same data rate as that of the input comparison signal. With some modification, it is also possible to set two comparison timings in one operational period.

3 Claims, 8 Drawing Sheets

LOGICAL COMPARISON CIRCUIT FOR AN IC TESTER

BACKGROUND OF THE INVENTION

The present invention relates to a logical comparison circuit which permits a logical comparison between the output (a signal to be compared) from an IC element under test and an expected value signal both in an interleaved form and the logical comparison at two phase-shifted timings set in one operation period (or test period).

Figure 1:
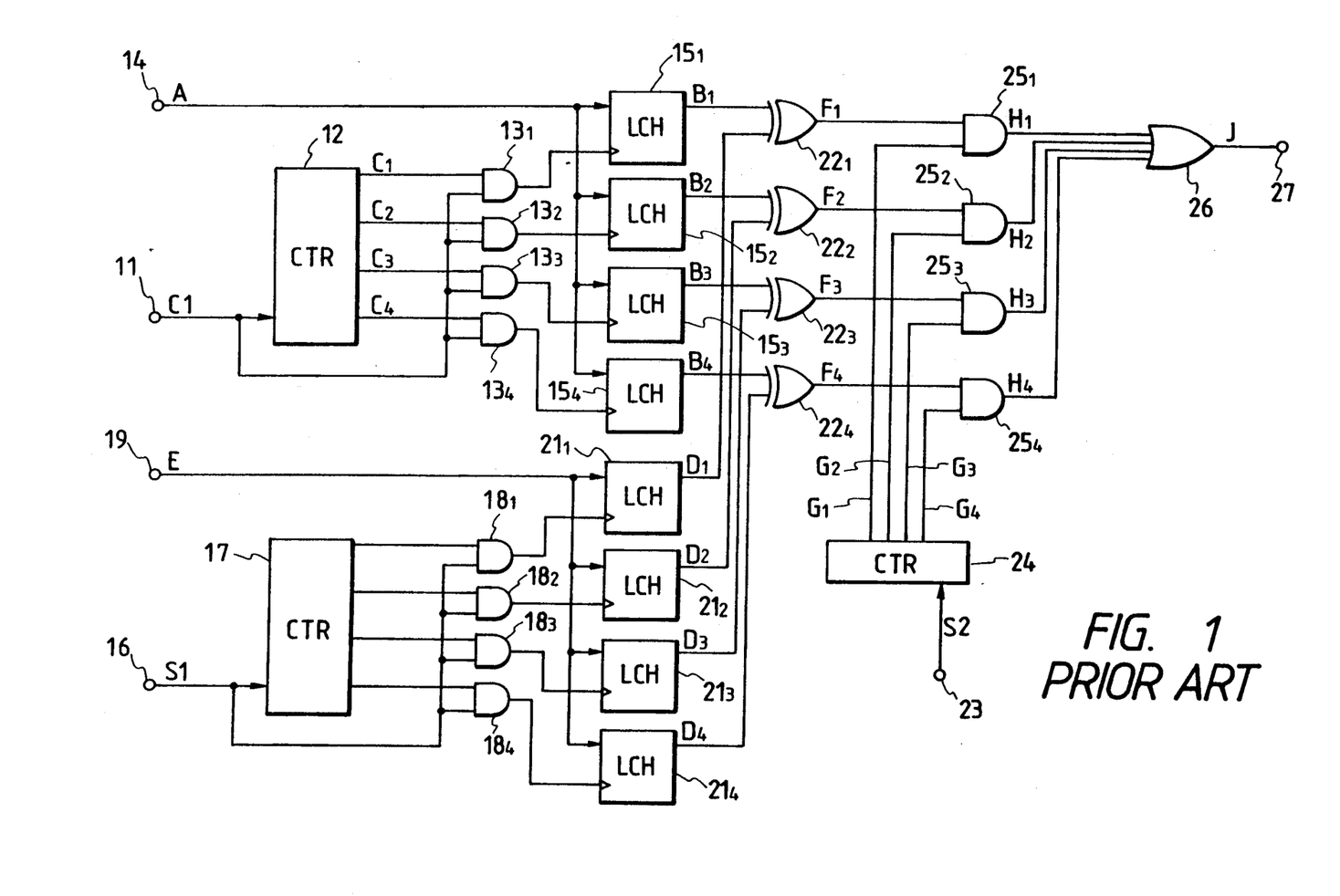
FIG. 1 is a block diagram showing a conventional logical comparison circuit.
Figure 2:
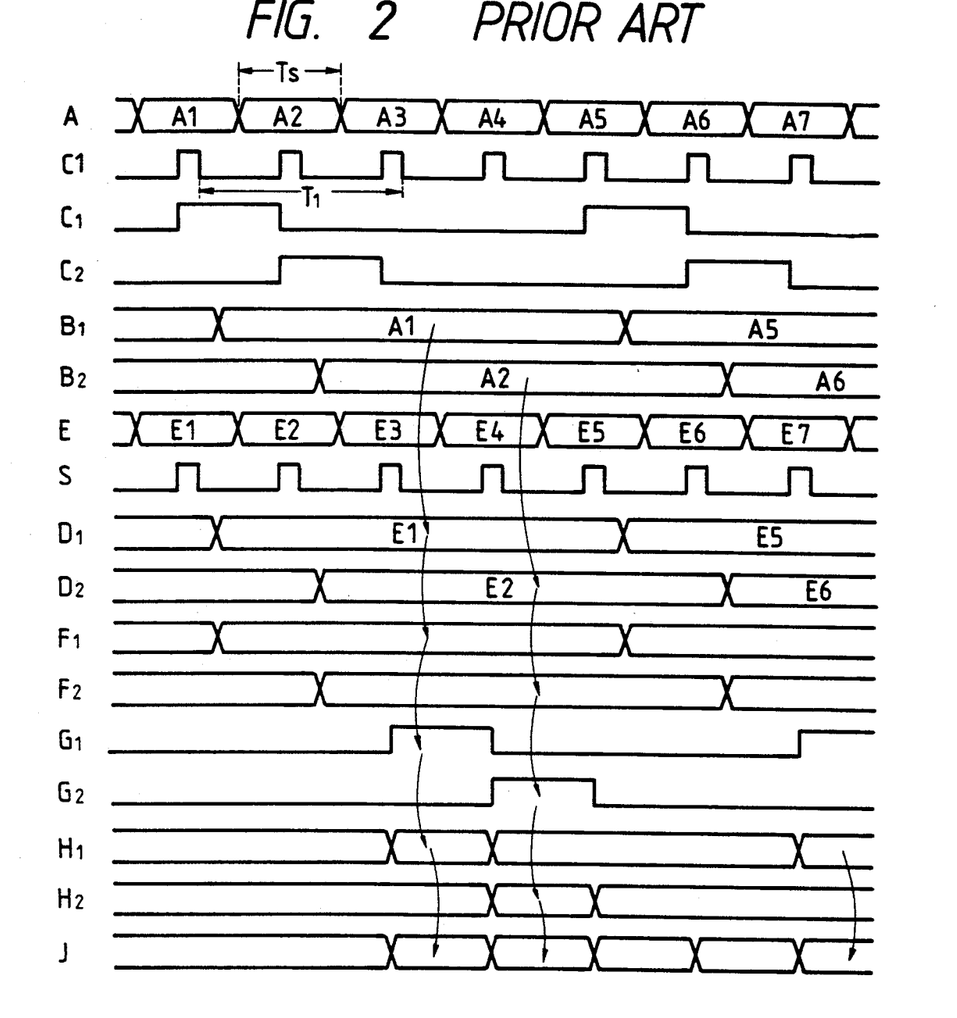
FIG. 2 is a timing chart for explaining the operation of the circuit depicted in FIG. 1.

FIG. 1 shows a conventional logical comparison circuit, the operation of which will be described first with reference to a timing chart depicted in FIG. 2. A first comparison clock (strobe) C1 of the same period as a test cycle period Ts is provided from a clock input terminal 11 to a 1-to-4 frequency dividing counter 12, which provides at its four output terminals frequency-divided outputs $C_1$, $C_2$, $C_3$, $C_4$ (only $C_1$ and $C_2$ shown in FIG. 2) of a period 4Ts which are phased the period Ts apart in a sequential, repeating cyclic order. The four frequency-divided output are supplied to gates $13_1$ to $13_4$ and the first comparison clock C1 at the terminal 11 is applied to the gates $13_1$ to $13_4$ in common thereto. As the result of this, clocks of the period 4Ts, cyclically displaced the period Ts apart in phase, are obtained at outputs of the gates $13_1$ to $13_4$. By these outputs comparison signals A, that is, outputs A1, A2, A3, ... from an IC element under test (not shown), are cyclically latched in latch circuits $15_1$ to $15_4$, from which signals $B_1$, $B_2$, $B_3$, $B_4$ (only $B_1$ and $B_2$ shown in FIG. 2) are output. Consequently, the output signal $B_1$ of the latch $15_1$, for example, is composed of demultiplexed comparison data A1, A5, A9, ... and the time length of each data has been expanded four times longer than the time length of data of the signal A.

A first system clock S1 from a clock input terminal 16, which has the same period as that of the first comparison clock C1, is frequency divided by a 1-to-4 frequency dividing counter 17 similar to the counter 12. The frequency-divided outputs from the 1-to-4 frequency dividing counter 17 are supplied to gates $18_1$ to $18_4$, respectively, and the first system clock S1 is applied to terminals of the gates $18_1$ to $18_4$ from the terminal 16. An expected value signal E from a terminal 19 is latched in latch circuits $21_1$ to $21_4$ by the outputs of the gates $18_1$ to $18_4$. Hence, the latches $21_1$ to $21_4$ output signals $D_1$ ($E_1$, $E_5$, $E_9$, ... ) to $D_4$ ($E_4$, $E_8$, $E_{12}$, ... ) four times longer than the expected value signal E as is the case with the signal A.

The corresponding ones of the outputs $B_1$ to $B_4$ from the latch circuits $15_1$ to $15_4$ and the outputs $D_1$ to $D_4$ from the latch circuits $21_1$ to $21_4$ are compared in comparators $22_1$ to $22_4$ each formed by an exclusive OR circuit, from which comparison result signals $F_1$ to $F_4$ (only $F_1$ and $F_2$ shown in FIG. 2) are output. A second system clock S2 from a clock input terminal 23 is frequency divided by a 1-to-4 frequency dividing counter 24 similar to those mentioned above, and corresponding ones of four frequency-divided outputs $G_1$ to $G_4$ from the 1-to-4 frequency dividing counter 24 (similar to the outputs $C_1$ to $C_4$ of the counter 12) and the outputs $F_1$ to $F_4$ from the comparators $22_1$ to $22_4$ are respectively applied to AND circuits $25_1$ to $25_4$. Thus the AND circuits $25_1$ to $25_4$ are enabled for the time TS in a sequential, repeating cyclic order, permitting the passage therethrough of the corresponding signals $F_1$ to $F_4$ accordingly. The outputs $H_1$ to $H_4$ from the AND circuits $25_1$ to $25_4$ applied to an OR circuit 26, wherein they are subjected to time division multiplexing, thereafter being provided as a decision result J to an output terminal 27 at the same data rate as that of the comparison signal A.

As described above, the signals A and E to be compared are each demultiplexed to plural pieces of data of expanded period and the corresponding ones of them are compared in parallel, after which the results of comparison are time-division-multiplexed for return to the same data rate as that of the input comparison signal A. In this way, the logical comparison of high-speed signals can accurately be made using circuits of law operating speed and the timing for comparison can be set at an arbitrary point of time within a period T1 longer than that Ts as shown in Row C1 of FIG. 2.

Figure 3:
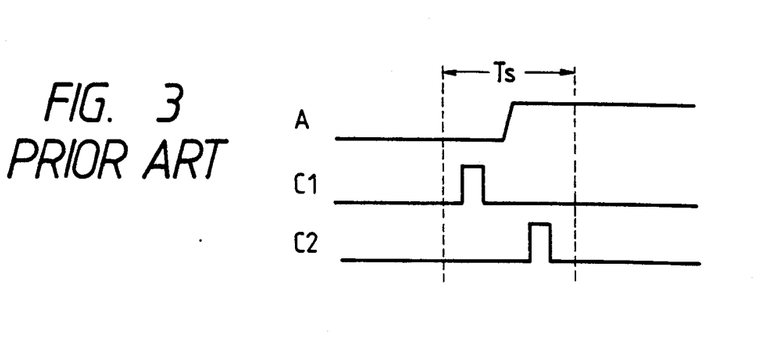
FIG. 3 is a waveform diagram showing the relationship of two comparison timing clocks to a data changing point in the comparison signal.

Incidentally, there is a case where a test is made to determine if the changing point of data of the comparison signal A, which is applied to the terminal 14, is within a predetermined limit. In such a test two comparison timings of two out-of-phase first and second comparison clocks C1 and C2, which define the limit, are set in the operation period Ts as shown in FIG. 3 and the comparison test is made at the timing of each comparison clock.

Figure 4:
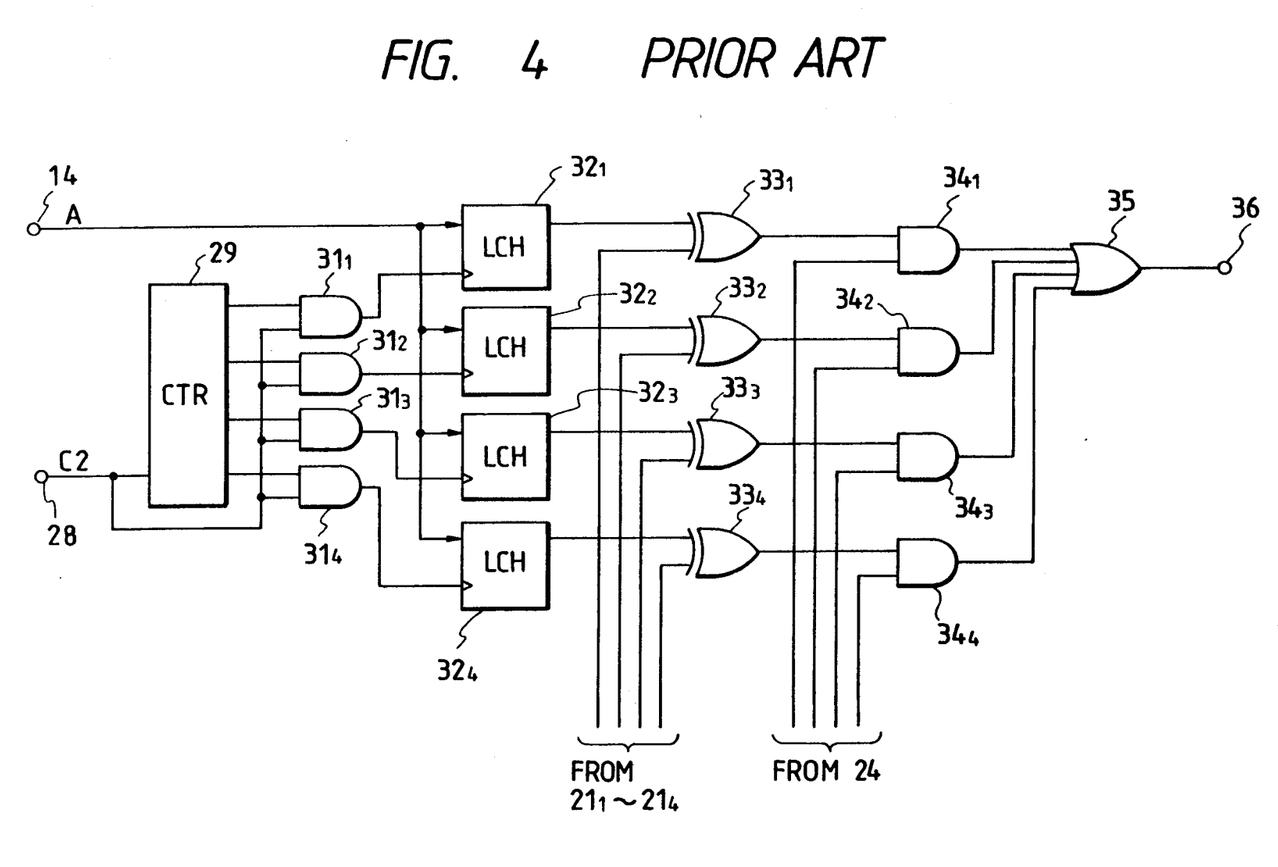
FIG. 4 is a block diagram showing a circuit which is added to the conventional logical comparison circuit in the case of setting two comparison timings in one operation period.

To this end, the prior art combines the circuit of FIG. 1 with a circuit of FIG. 4 which is composed of circuits similar to the counter 12, the gates $13_1$ to $13_4$, the latches $15_1$ to $15_4$, comparators $22_1$ to $22_4$, the gates $25_1$ to $25_4$ and the OR circuit 26 in FIG. 1. The second comparison clock C2 from a clock input terminal 28 is frequency divided by a 1-to-4 frequency dividing counter 29 and its four frequency-divided outputs are applied to gates $31_1$ to $31_4$, respectively. The second comparison clock C2 applied to the gates $31_1$ to $31_4$ in common thereto from the terminal 28 and the outputs of the gates $31_1$ to $31_4$ are provided to latch circuits $32_1$ to $32_4$ to latch therein the comparison signal A from the terminal 14 in FIG. 1. The outputs of the latch circuits $32_1$ to $32_4$ and the outputs of the latch circuits $21_1$ to $21_4$ in FIG. 1 are compared in comparators $33_1$ to $33_4$, respectively, and the corresponding ones of the outputs from the comparators $33_1$ to $33_4$ and the four outputs from the counter 24 in FIG. 1 are supplied to AND circuits $34_1$ to $34_4$, respectively. The outputs of the AND circuits $34_1$ to $34_1$ are provided to an OR circuit 35, from which the result of decision about the comparison at the timing of the second comparison clock C2 is provided to an output terminal 36.

Thus it is necessary in the prior art, for simultaneous setting of two comparison timings in one operation period Ts, to use a pair of circuits which are exactly the same as that including the 1-to-4 frequency dividing counter 12, the gates $13_1$ to $13_4$, the latch circuits $15_1$ to $15_4$, the comparators $22_1$ to $22_4$ and the AND circuits $25_1$ to $25_4$ in FIG. 1. Normally the comparison timing in one operation period is at one point of time and, on rare occasions, at two points. Hence the prior art involves an appreciable amount of extra hardware for setting two comparison timings but it is not frequently used and is left out of operation at almost all times.

SUMMARY OF THE INVENTION

It is therefore an object of the present invention to provide a logical comparison circuit which is switchable between operations of setting one and two comparison timings in one operation period and, in either operation, high in the efficiency of utilization as a whole and hence is relatively small-scale in its overall circuit arrangement.

The logical comparison circuit according to the present invention includes: first counter means which is switched by a select signal between the operation of one 1-to-n frequency dividing counter for frequency dividing the first comparison clock and the operation of two 1-to-n/2 frequency dividing counters for frequency dividing the first and second comparison clocks, respectively; second counter means which is switched by a select signal between the operation of one 1-to-n frequency dividing counter for frequency dividing the first system clock and the operation of two 1-to-n/2 frequency dividing counters for respectively frequency dividing the first system clock; and third counter means which is switched by a select signal between the operation of one 1-to-n frequency dividing counter for frequency dividing the second system clock and the operation of two 1-to-n/2 frequency counters for respectively frequency dividing the second system clock. n outputs of the first counter means are used to expand the comparison signal; n outputs of the second counter means is used to expand the expected value signal; and n outputs of the third counter means is used for time division multiplexing of the result of comparison to the operation period of the comparison signal. In the case of setting one comparison timing in one operation period, the first, second and third counter means are all switched to the operation of the 1-to-n frequency dividing counter, by which the comparison signal and the expected value signal are expanded n times and the same operation as in the prior art is performed. In the case of setting two comparison timings in one operation period, the first, second and third counter means are all switched to the operation of the 1-to-n/2 frequency dividing counter, by which the comparison signal and the expected value signal are expanded n/2 times, and outputs of n/2 comparators corresponding to the first comparison clock are output after being returned to the previous operation period, and at the same time, outputs of the other n/2 comparators corresponding to the second comparison clock are output also after being returned to the previous operation period.

DESCRIPTION OF THE PREFERRED EMBODIMENT

Figure 5:
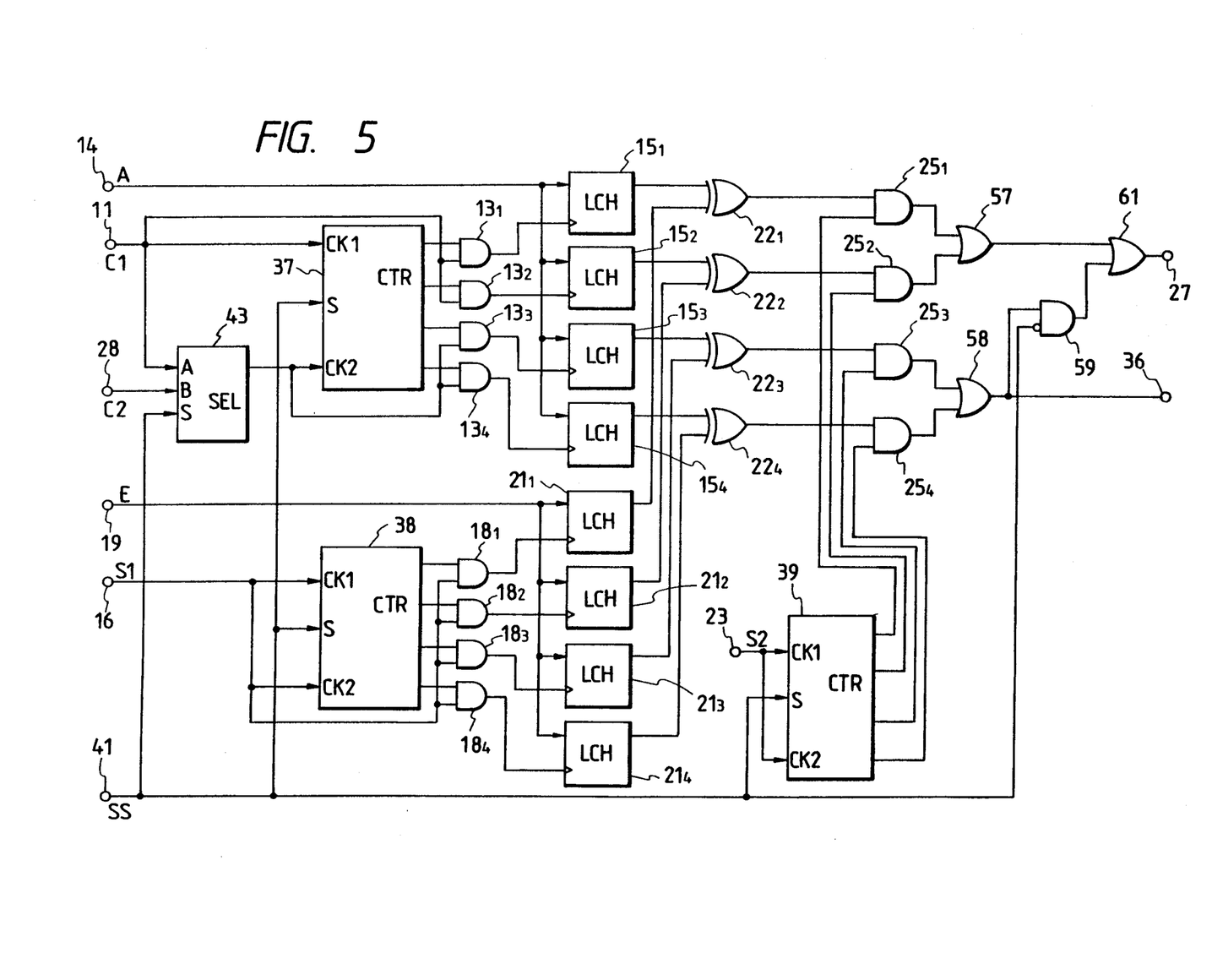
FIG. 5 is a block diagram illustrating an embodiment of the present invention.

FIG. 5 illustrates an embodiment of the present invention, in which the parts corresponding to those in FIGS. 1 and 4 are identified by the same reference numerals. For instance, n is a value represented by $2^m$ (where m is a positive integer), and in this embodiment, n=4. In the present invention first, second and third counters 37, 38 and 39 are provided, each of which has first and second inputs CK1 and CK2 and operates under control of a select signal SS from a terminal 41. For example, when the select signal SS is at the "0" level, the first to third counters 37 to 39 each serves as one 1-to-4 frequency dividing counter which frequency divides, down to ¼, clock pulses of the period Ts supplied to the first and second inputs CK1 and CK2 in common to them and provides four frequency-divided outputs which are sequentially displaced the period Ts apart in a cyclic and each have a period four times longer than the period Ts. When the select signal SS is at the "1" level, each counter operates as two 1-to-2 (=n/2) frequency dividing counters which are driven separately by the clock pulses applied to the first and second input CK1 and CK2, respectively. A selector 43 is controlled by the select signal SS to select either one of the first and second comparison clocks C1 and C2 and provides it to the second input CK2 of the first counter 37. In this example, since the first comparison clock C1 is selected when the select signal SS is at the "0" level, the first and second inputs CK1 and CK2 of the counter 37 are supplied with the same first comparison clock C1. Consequently, the gates $13_1$ to $13_4$ are all supplied with the same first comparison clock C1 and the first counter 37 and the gates $13_1$ to $13_4$ perform exactly the same operation as is the case with combination of the counter 12 and the gates $13_1$ to $13_4$ in FIG. 1.

When the select signal SS is at the "1" level, the selector 43 selects and applies the second comparison clock C2 to the second input CK2 of the first counter 37. In this instance, the first counter 37 is driven by the comparison clock C1 applied to the first input CK1 to operate as a 1-to-2 frequency dividing counter and its two outputs are fed to the gates $13_1$ and $13_2$. At the same time, the first counter 27 is driven by the second comparison clock C1 applied to the second input CK2 to operate as a 1-to-2 frequency dividing counter and its two outputs are provided to the gates $13_3$ and $13_4$. The first and second inputs CK1 and CK2 of the second counter 38 are supplied with the same first system clock S1 and the first and second input CK1 and CK2 of the third counter 39 are supplied with the same second system clock S2, and when the select signal SS is at the "0" level, the second and third counters perform the 1-to-4 frequency dividing operation, and hence operate in the same manner as do the counters 17 and 24 in FIG. 1. As is the case with FIG. 1, the outputs of the gates $13_1$ to $13_4$ and $18_1$ to $18_4$ are applied to trigger terminals of the latches $15_1$ to $15_4$ and $21_1$ to $21_4$, respectively, and their outputs are compared in comparators $22_1$ to $22_4$.

Figure 6:
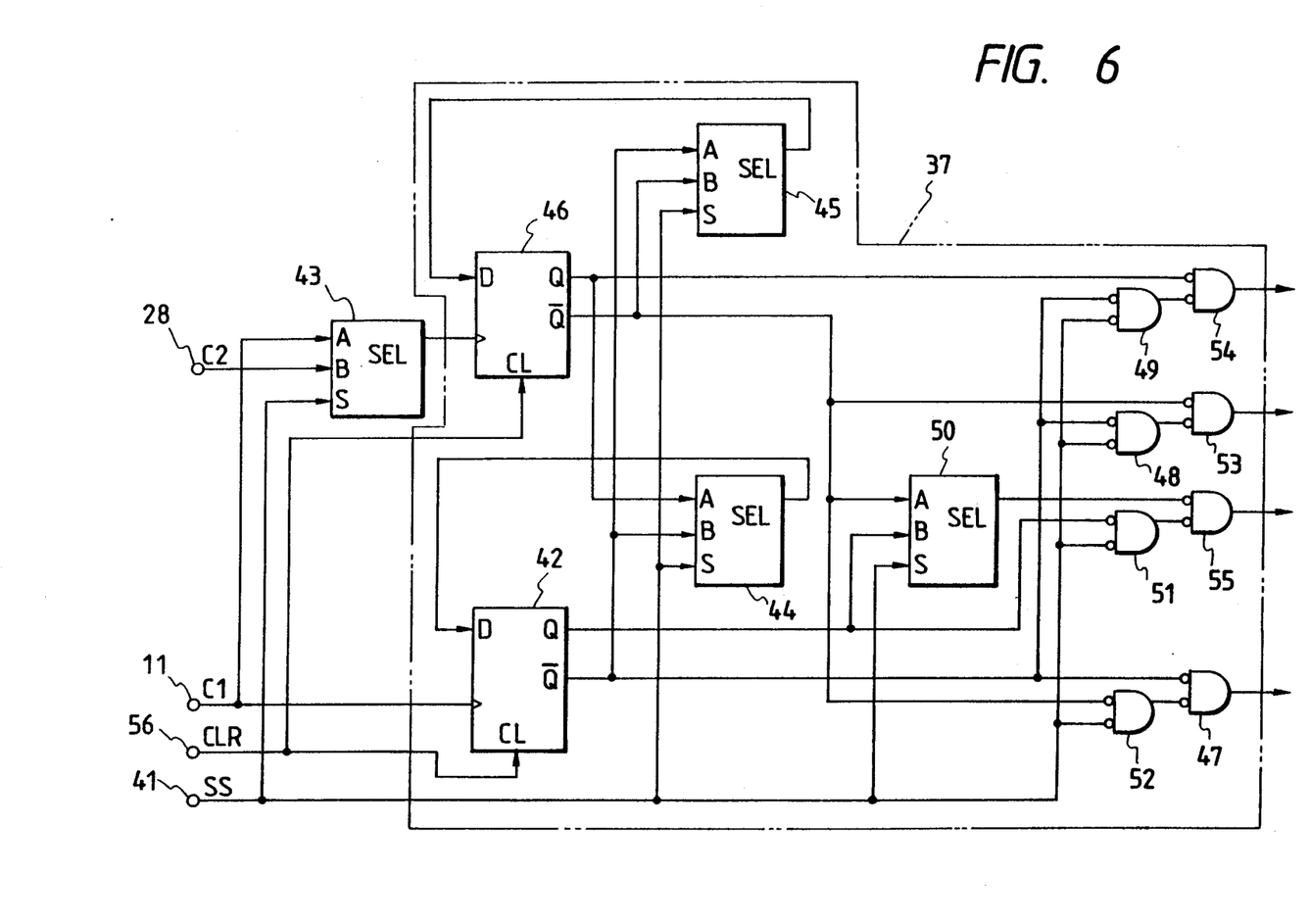
FIG. 6 is a block diagram illustrating a specific operative example of a first counter 37 in the embodiment of FIG. 5.

The counter which is switchable between the operation as one 1-to-4 frequency divider and the operation as two 1-to-2 frequency dividers has such a construction as shown in FIG. 6. FIG. 6 exemplifies the first counter 37, wherein the first comparison clock C1 at the terminal 11 is applied to a trigger terminal of a flip-flop 42 and an input A of the selector 43. The second comparison clock C2 at the terminal 28 is applied to an input B of the selector 43. An inverted output Q of the flip-flop 42 is provided to an input B of a selector 44 and an input A of a selector 45. The output of the selector 43 is applied to a trigger terminal of a flip-flop 46. An inverted output Q of the flip-flop 42 is provided to an input A of a selector 50 and an input B of the selector 45. The output of the selector 44 is applied to a data input terminal D of the flip-flop 42 and the output of the selector 45 is applied to a data input terminal D of the flip-flop 46. The inverted output Q of the flip-flop 42 is applied to AND circuits 47, 48, and 49 as well and a non-inverted output Q of the flip-flop 46 is applied to an input B of the selector 50 and an AND circuit 51. An inverted output Q of the flip-flop 46 is also provided to AND circuits 52 and 53 and a non-inverted output Q of the flip-flop 46 is provided to an AND circuit 54. The output of the selector 50 is applied to an AND circuit 55. The selectors 43, 44, 45 and 50 are each controlled by the select signal SS from the terminal 44 to select the input A or B, depending on whether the select signal SS is at the "0" or "1" level. The select signal SS is supplied to the AND circuits 48, 49, 51 and 52, the outputs of which are applied to the AND circuits 53, 54, 55 and 47, respectively. The flip-flops 42 and 46 are cleared by a clear signal CLR from a terminal 56 at the start of the logical comparison test.

Figure 7:
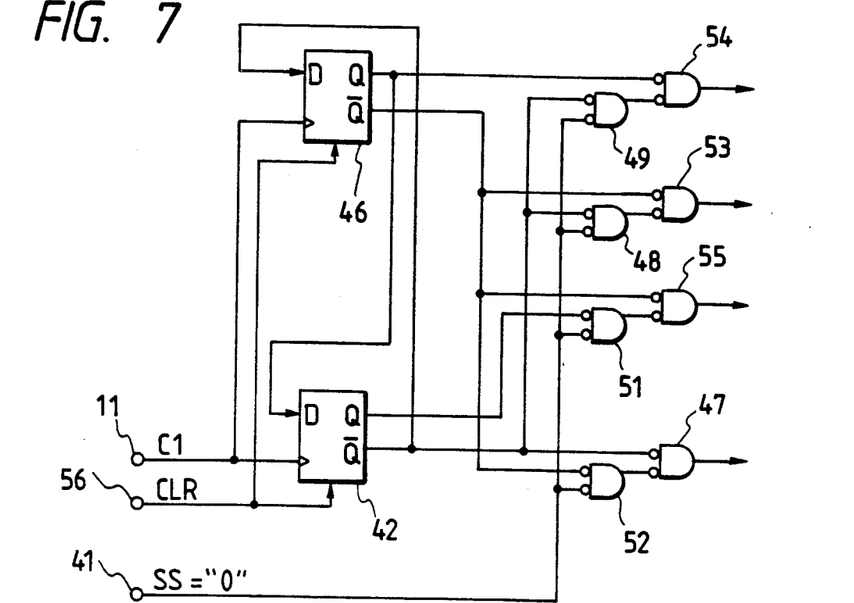
FIG. 7 is a block diagram showing the state in which the first counter 37 depicted in FIG. 6 is switched to the operation of a 1-to-4 frequency dividing counter.
Figure 8:
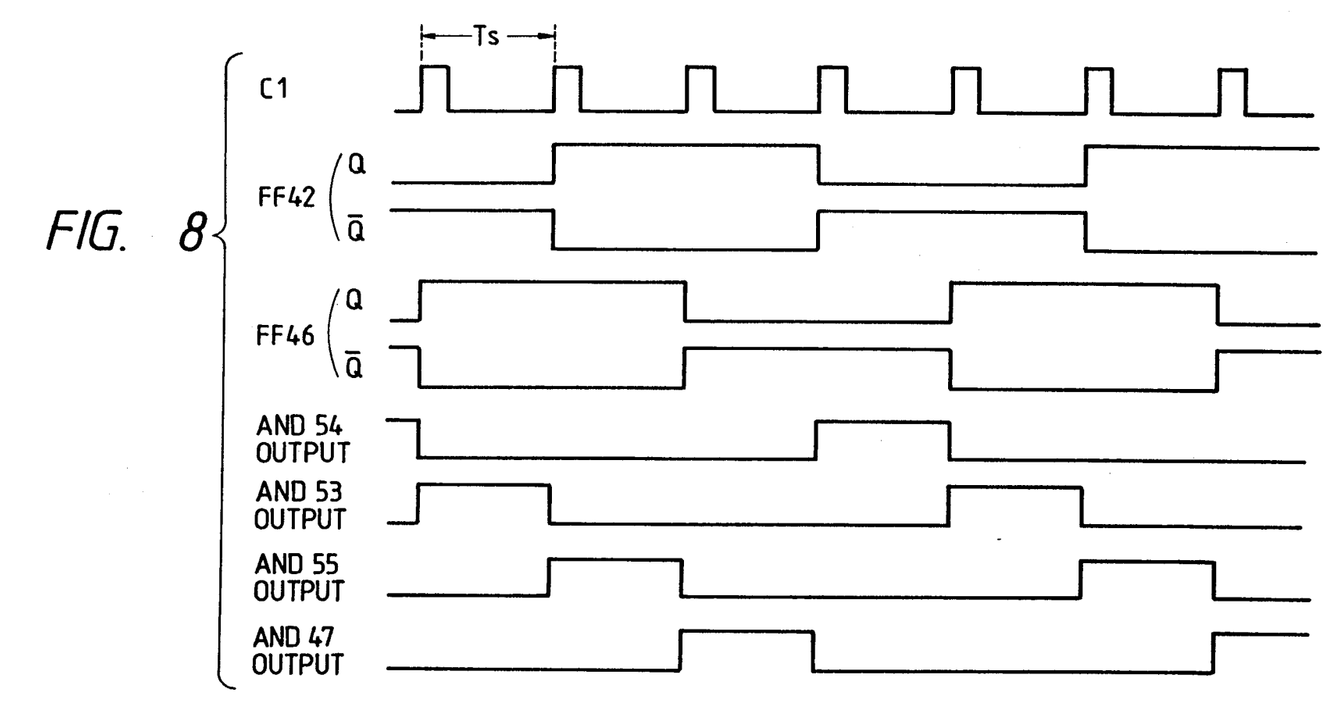
FIG. 8 is a timing chart for explaining the operation of the circuit depicted in FIG. 7.

When the select signal SS at the terminal 44 is set to the "0" level, the selectors 43 to 45 and 50 select the input A, and consequently, the circuit of FIG. 6 becomes connected as shown in FIG. 7. That is, the inverted output Q of the flip-flop 42 is connected to the data input terminal D of the flip-flop 46 and the non-inverted output Q of the latter is connected to the data input terminal D of the former. Upon each application of the first comparison clock C1 from the terminal 11 to the trigger terminals of the flip-flops 42 and 46 in common thereto, the states of the outputs Q and Q of the flip-flops 42 and 46 alternately reverse as depicted in FIG. 8. Hence, the counter operates as a 1-to-4 frequency dividing counter which, upon each application of the clock C1, provides outputs "1" in a cyclic order [output Q of the flip-flop 42-output Q of the flip-flop 46-output Q of the flip-flop 42-output Q of the flip-flop 46]. Since the select signal SS is at the "0" level, the AND gates 48, 49, 51 and 52 remain enabled and the gates 48 and 49 each provide an inverted version of the Q output of the flip-flop 42 (i.e. the same signal as the Q output of the flip-flop 42), whereas the gates 51 and 52 provide inverted versions of the Q output of the flip-flop 42 and the Q output of the flip-flop 46 (that is, the same signals as the Q output of the flip-flop 42 and the Q output of the flip-flop 46, respectively). The outputs of the gates 49, 48, 51 and 52 are applied to the AND gates 54, 53, 55 and 47, respectively, wherein they are ANDed with the Q output, Q output and Q output of the flip-flop 46 and the Q output of the flip-flop 42, thereby producing four outputs shown on the last four rows in FIG. 8. That is, pulses each having a pulse width Ts and sequentially displaced the period Ts apart in phase are output from the AND circuits 54, 53, 55 and 47 with a period 4Ts.

Figure 9:
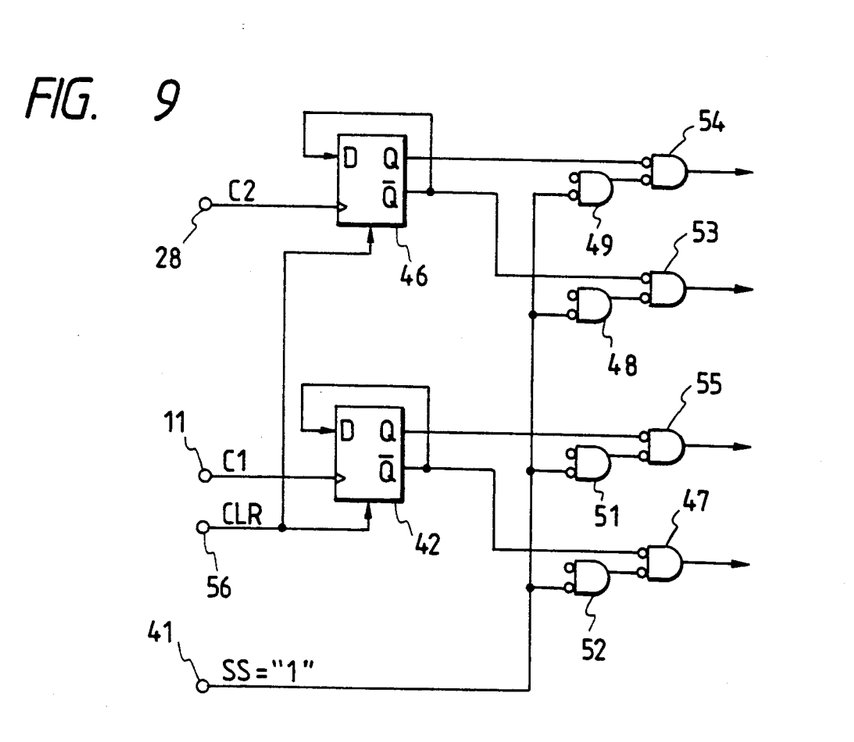
FIG. 9 is a block diagram showing the state in which the counter depicted in FIG. 6 is put to the operation of a 1-to-2 frequency dividing counter.

When the select signal SS is set to the "1" level, the selectors 43 to 45 and 50 select the input B, and consequently, the circuit of FIG. 6 becomes connected as depicted in FIG. 9, wherein the flip-flops 42 and 46 operate as 1-to-2 frequency dividing counters which frequency divide the first and second comparison clocks C1 and C2, respectively. Since the select signal SS is at the "1" level, the AND gates 49, 48, 51 and 52 all output "0s", holding the AND gates 54, 53, 55 and 47 enabled. Hence the AND circuits 55 and 47 provide 180° out-of-phase signals obtained by frequency dividing the first comparison clock C1 down to ½, and the AND circuits 53 and 54 provide 190° out-of-phase signals obtained by frequency dividing the second comparison clock C2 down to ½.

The second and third counters 38 and 39 in FIG. 5 are identical in operation with the first counter 37 except that, in the case of the second counter 38, the first system clock S1 at the terminal 16 is applied to the trigger terminals of the flip-flops 42 and 46 in common to them in FIG. 6 and that, in the case of the third counter 39, the second system clock S2 at the terminal 23 is applied to the trigger terminals of the flip-flops 42 and 46 in common to them in FIG. 6. Hence no description will be given of the operations of the second and third counters 38 and 39.

Turning back to FIG. 5, the outputs of the AND circuits $25_1$ and $25_2$ are applied to an OR circuit 57, wherein they are time-division multiplexed, and the outputs of the AND circuits $25_3$ and $25_4$ are applied to an OR circuit 58, wherein they are time-division multiplexed. The output of the OR circuit 58 is provided to an inhibit gate 59, to which the select signal SS at the terminal 41 is applied as an inhibit signal. The output of the gate 59 and the output of the OR circuit 57 are fed to an OR circuit 61, wherein they are time-division multiplexed, and the output of the OR circuit 61 is provided to the output terminal 27. The output of the OR circuit 58 is fed to an output terminal 36. The gates $13_1$ and $13_2$ are supplied with the first comparison clock C1 as in the prior art, but the gates $13_3$ and $13_4$ are supplied with the output of the selector 43.

With the arrangement shown in FIG. 5, in the case of setting one comparison timing in one operation period Ts of the comparison signal A at the terminal 14, the select signal SS at the terminal 41 is set to the "0" level. At this time, the first, second and third counters 37, 38 and 39 each operate as a 1-to-4 frequency dividing counter, the selector 43 outputs the first comparison clock C1 and the inhibit gate 59 is not disabled, so that the circuit depicted in FIG. 5 enters exactly the same state as is the case with the circuit shown in FIG. 1.

On the other hand, when the select signal SS at the terminal 41 is at the "1" level, the first, second and third counters 37, 38 and 39 each operate as two 1-to-2 (=n/2) frequency dividing counters and in the latch circuits $15_1$ and $15_2$ the comparison signal A from the terminal A is expanded to 2 Ts at the timing of the first comparison clock C1 at the terminal 11. The thus expanded comparison signals A and the expected value signals E expanded by the latch circuits $21_1$ and $21_2$ to 2 Ts are compared by the comparators $22_1$ and $22_2$, respectively, and the result of decision of the comparison at the timing of the first comparison clock C1 is obtained at the output terminal 27. In the latch circuits $15_3$ and $15_4$ the comparison signal A from the terminal 14 is expanded to 2 Ts. The thus expanded comparison signals A and the expected value signals E expanded by the latch circuits $21_3$ and $21_4$ are respectively compared by the comparators $22_3$ and $22_4$, and the compared outputs are provided via the OR circuit 58 to the output terminal 36, that is, the output corresponding to the output at the terminal 36 in FIG. 4 is obtained. In this way, the outputs corresponding to those in the state in which the circuits depicted in FIGS. 1 and 4 are combined are provided at the terminals 27 and 36. In other words, logical comparison outputs, with two comparison timings in one operation period, can be obtained.

While in the above n=4, n is not limited specifically thereto but may be set to, for example, 8, 16, ..., generally, $2^m$, m being a positive integer.

Figure 10:
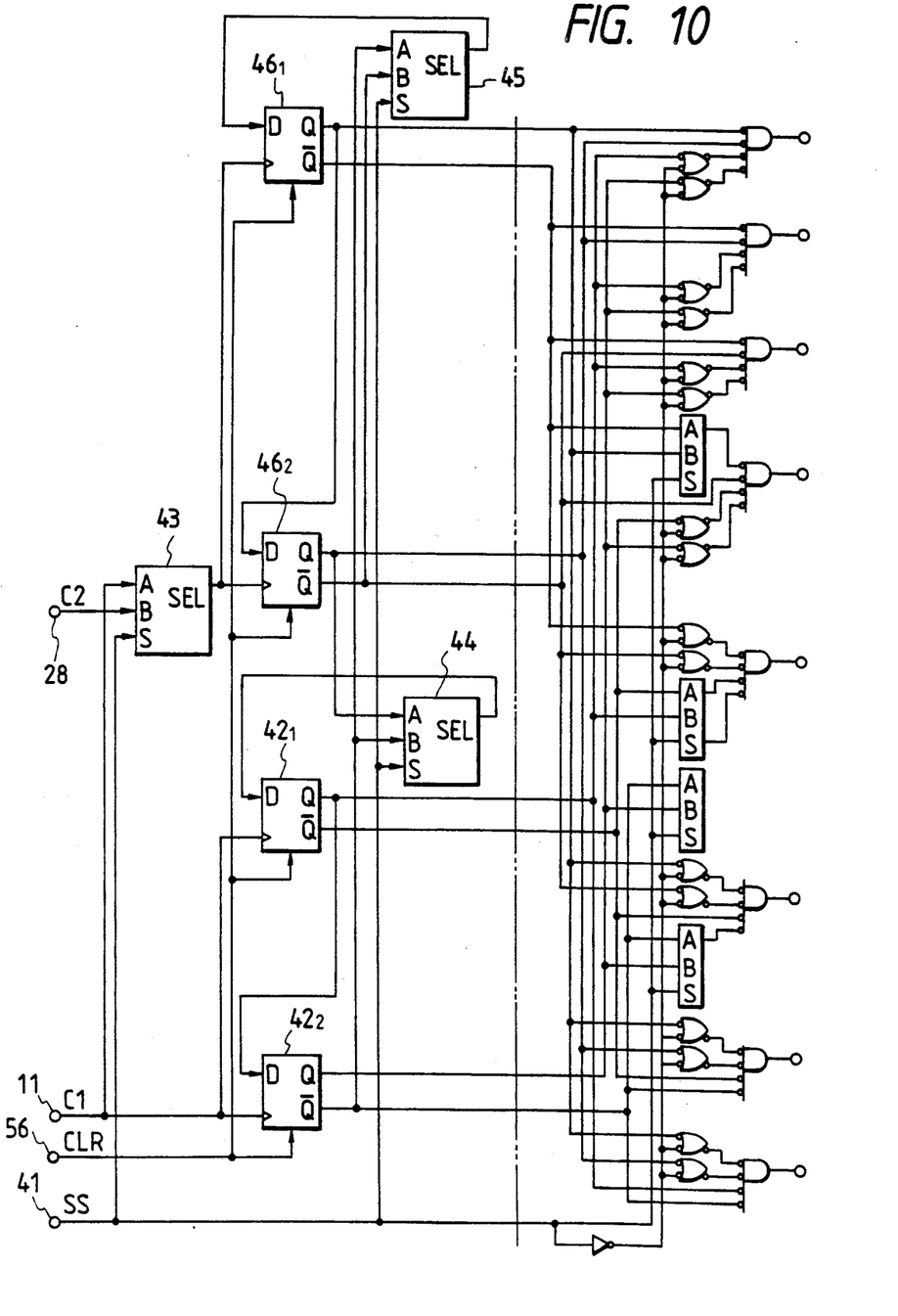
FIG. 10 is a circuit diagram illustrating the construction of the first counter 37 in the case of n=8.

FIG. 10 illustrates an example of the construction of the first counter 37 in the case of n=8, so as to facilitate a better understanding of the principle of operation of the first counter 37 when n=4. The parts corresponding to those in FIG. 6 are identified by the same reference numerals. Four flip-flops $46_1$, $46_2$, $42_1$ and $42_2$ are provided. The flip-flops $42_1$ and $42_2$ are always triggered by the first comparison clock C1 irrespective of the select signal SS, whereas the flip-flops $46_1$ and $46_2$ are triggered by the first or second comparison clock C1 or C2 selectively output, depending on whether the select signal SS is at the "0" or "1" level. A non-inverted output Q of the flip-flop $46_1$ is provided to a data input terminal D of the flip-flop $46_2$ and a non-inverted output Q of the flip-flop $42_1$ is provided to a data input terminal D of the flip-flop $42_2$. When the select signal SS is at the "0" level, a non-inverted output Q of the flip-flop $46_2$ is connected via the selector 44 to a data input terminal D of the flip-flop $42_1$ and an inverted output Q of the flip-flop $42_1$ is connected via the selector 45 to the data input terminal D of the flip-flop $46_2$. Consequently, all the flip-flops $46_1$, $46_2$, $42_1$ and $42_2$ are connected in cascade and an inverted output Q of the flip-flop $42_2$ at the final stage of cascade connection is fed back to the data input terminal D of the first-stage flip-flop $46_1$. That is, in the initial state in which all the flip-flops have been cleared by the clear signal CLR, the inverted output Q=1 of the final-stage flip-flop $42_2$ in being provided to the data input terminal D of the first-stage flip-flop $46_1$. Thereafter, upon each application of the first comparison clock C1 to all of the flip-flops, the flip-flops $46_1$, $46_2$, $42_1$ and $42_2$ and sequentially fetch therein the data being provided to their data input terminals D, providing the state wherein all the flip-flops retain "1" by four first comparison clock C1. At this time, the inverted output Q of the flip-flop $42_2$ goes to the "0" level, and consequently, the flip-flops $46_1$, $46_2$, $42_1$ and $42_2$ sequentially fetch therein "0" in response to the next four first comparison clocks C1. Thus the four flip-flops provide frequency-divided outputs shifted in phase by the period Ts of the first comparison clock C1 and having a period 8 Ts as is the case with the output waveforms of the flip-flops 42 and 46 shown in FIG. 8. These frequency-divided outputs are converted to signals each having a pulse width Ts and a period 8Ts, by desired logical circuits such as shown in FIG. 7 which are similar to those formed by the gates 47, 48, 49, 51, 52, 53, 54 and 55 in FIG. 6. These logical circuits obvious to those skilled in the art, hence no description will be given of them.

When the select signal SS is at the "1" level, the inverted output Q of the flip-flop $46_2$ is connected via the selector 45 to the data input terminal D of the flip-flop $46_1$ and likewise the inverted output Q of the flip-flop $42_2$ is connected via the selector 44 to the data input terminal D of the flip-flop $42_1$. Accordingly, the pair of flip-flops $42_1$ and $42_2$ and the pair of flip-flops $46_1$ and $46_2$ both enter the same state of connection between the flip-flops 42 and 46 depicted in FIG. 7, and they frequency divide the first and second comparison clocks down to ¼, respectively. These frequency-divided outputs are converted to signals of a pulse width Ts and a period 4 Ts, by logical circuits formed by gates.

As will be seen from the above, the first, second and third counters 37, 38 and 39 used in the present invention each include n/2 flip-flops each having non-inverted and inverted outputs. Of the n/2 flip-flops, n/4 flip-flops forming a first group are connected in cascade and are triggered by a common clock. The remaining n/2 flip-flops forming a second group are also connected in cascade and are triggered by a common clock. The first selector 44 connects the flip-flops of the first and second groups in cascade or connects the final-stage output of the second group to the first stage thereof, depending on whether the select signal SS is at the "0" of "1" level. In this way, each counter can be switched between the operation of one 1-to-n frequency dividing counter which provides from n/2 flip-flops n frequency-divided outputs displaced one clock apart in phase and having a period equal to an n-clock period and the operation of two 1-to-n/2 frequency dividing counters each of which provides n/2 frequency-divided outputs displaced one clock apart in phase ans having a period equal to an n/2-clock period. The second and third counters 38 and 39 need only to be constructed so that all the flip-flops of the respective counters are triggered by the common first system clock S1 and the common second system clock S2, respectively.

As described above, according to the present invention, it is possible, with the provision of counters each of which is switchable between the operation of one 1-to-n frequency dividing counter and the operation of two 1-to-n/2 frequency dividing counter, to set comparison timings in one operation period for a logical comparison of interleaved signals, through utilization of circuit elements which are used when one comparison timing is set in one operation period. Consequently, the scale of hardware used can be reduced accordingly. Moreover, it is possible to decrease the amount of extra hardware which is idle during the normal operation of making a logical comparison with one comparison timing set in one operation period.

It will be apparent that many modifications and variations may be effected without departing from the scope of the novel concepts of the present invention.

What is claimed is:

1. A logical comparison circuit for an IC tester, comprising:
   first counter means which is switched by a select signal between the operation of one 1-to-n frequency dividing counter which frequency divides a first comparison clock and provides n frequency-divided outputs phased apart in a sequential, cyclic order and the operation of two 1-to-n/2 frequency dividing counters which frequency divide first and second comparison clocks, respectively, and provide n/2 frequency-divided outputs phased apart in a sequential, cyclic order, n being an integer equal to or greater than 2;
   n first latch circuits for latching therein a comparison signal by n outputs of said first counter means;
   second counter means which is switched by said select signal between the operation of one 1-to-n frequency dividing counter which frequency divides a first system clock and provides n frequency-divided output phased apart on a sequential, cyclic order and the operation of two 1-to-n/2 frequency dividing counters each of which frequency divides said first system clock and provides n/2 frequency-divided outputs phased apart in a sequential, cyclic order;

n second latch circuits for latching therein an expected value signal by n outputs of said second counter means;

n comparators for comparing the corresponding ones of the outputs of said n first latch circuits and the outputs of said n second latch circuits;

third counter means which is switched by said select signal between the operation of one 1-to-n frequency dividing counter which frequency divides a second system clock and provides n frequency-divided outputs phased apart in a sequential, cyclic order and the operation of two 1-to-n/2 frequency dividing counters each of which frequency divides said second system clock and provides n/2 frequency-divided outputs phased apart in a sequential, cyclic order;

n AND circuits which are supplied with corresponding ones of n outputs of said third counter means and the outputs of said n comparators, respectively.

two OR circuits each of which is supplied with n/2 outputs of said n AND circuits;

an inhibit gate which is supplied with the output of one of said two OR circuits and is controlled by said select signal; and an OR circuit which is supplied with the output of said inhibit gate and the output of the other of said two OR circuits.

2. The logical comparison circuit of claim 1 which further comprises select means for selectively outputting one of said first and second comparison clocks in response to said select signal and wherein said first counter means has a first input which is supplied with said first comparison clock and a second input which is supplied with the output of said select means.

3. The logical comparison circuit of claim 2 wherein said first, second and third counter means each include:

a first flip-flop group composed of n/4 flip-flop stages which have non-inverted and inverted outputs and are connected in cascade and triggered by a common clock;

a second flip-flop group composed of n/4 flip-flop stages which have non-inverted and inverted outputs and are connected in cascade and triggered by a common clock;

first selector means which responds to said select signal to connect the final-stage output of said first flip-flop group to the first-stage input of said second flip-flop group or the final-stage output of said second flip-flop group to the first-stage input thereof;

second selector means which responds to said select signal to connect the final-stage output of said second or first flip-flop group to the first-stage input of said first flip-flop group; and logical gate circuit means for converting the non-inverted and inverted outputs of said first and second flip-flop groups to signals of a predetermined pulse width.

* * * * *